(12) United States Patent
Reed et al.

(10) Patent No.: US 6,924,687 B2
(45) Date of Patent: Aug. 2, 2005

(54) VOLTAGE TOLERANT CIRCUIT FOR PROTECTING AN INPUT BUFFER

(75) Inventors: Brian Reed, San Jose, CA (US); Puneet Sawhney, San Jose, CA (US); Jayanth Thyamagundlam, Milpitas, CA (US); Scott T. Becker, Darien, IL (US)

(73) Assignee: Artisan Components, Inc., Sunnyvale, CA (US)

( * ) Notice: Subject to any disclaimer, the term of this patent is extended or adjusted under 35 U.S.C. 154(b) by 0 days.

(21) Appl. No.: 10/630,949

(22) Filed: Jul. 29, 2003

(65) Prior Publication Data

US 2005/0024101 A1 Feb. 3, 2005

(51) Int. Cl.[7] .................................................. H03L 5/00
(52) U.S. Cl. ..................... 327/323; 361/91.1; 361/91.7; 361/93.9
(58) Field of Search ................................. 327/323, 108, 327/306, 318, 309, 354, 333, 112; 326/80; 361/91.1, 56, 91.7, 93.9

(56) References Cited

U.S. PATENT DOCUMENTS

| | | | | |
|---|---|---|---|---|
| 5,973,530 A | * | 10/1999 | Morris et al. | ................ 327/210 |
| 6,150,843 A | * | 11/2000 | Shiffer et al. | .................. 326/80 |
| 6,271,703 B1 | * | 8/2001 | Wert | ........................... 327/309 |
| 6,342,996 B1 | * | 1/2002 | Drapkin et al. | ............ 361/91.1 |
| 6,441,670 B1 | * | 8/2002 | Coughlin et al. | ........... 327/323 |

* cited by examiner

Primary Examiner—Tuan T. Lam
Assistant Examiner—Hiep Nguyen
(74) Attorney, Agent, or Firm—Martine Penilla & Gencarella, LLP

(57) ABSTRACT

An invention is disclosed for protecting an input buffer. A current from a p-supply to an input buffer is lowered when an input voltage to the input buffer is tolerant HIGH. The p-supply being a $V_{DD}$ voltage supplied to a p-channel transistor in the input buffer. In addition, the p-supply is set to a particular voltage when the input voltage to the input buffer is LOW, the particular voltage being at a specific value such that input transistors within the input buffer do not experience overstress voltages. Optionally, p-supply can be prevented from supplying current to the input buffer when an input voltage to the input buffer is tolerant HIGH.

11 Claims, 7 Drawing Sheets

VOLTAGE TOLERANT CIRCUIT FOR PROTECTING AN INPUT BUFFER

BACKGROUND OF THE INVENTION

1. Field of the Invention

This invention relates generally to semiconductor input/output drivers, and more particularly to voltage tolerant circuits for protecting input buffers in semiconductor input/output drivers.

2. Description of the Related Art

In today's world of smaller process geometries, board voltages have not kept up with chip voltages. As a result, there is a need for tolerant input/output (I/O) designs that can tolerate higher voltages on the boards than the voltages used for internal operation of the chips. That is, the input section of an I/O circuit generally requires some form of protection. For example, FIG. 1 shows an exemplary printed circuit board (PCB) configuration 100. The PCB configuration 100 includes a PCB 102 and a plurality of chips 104a–104b disposed on the PCB 102. Each chip 104a–104b includes an I/O ring 106a–106b that provides I/O operations for the chip 104a–104b. Although only two chips 104a–104b are illustrated in FIG. 1, it should be borne in mind that a typical PCB configuration 100 will include many chips 104a–104b disposed throughout the PCB 102.

The various chips on the PCB 102 can operate at different voltages. For example, chip 104a can be a 0.13 micron chip that operates at 1.2 volts, and chip 104b can be a 0.25 micron chip that operations at 2.25 volts. As can be appreciated, a voltage mismatch occurs when chip 104b drives a signal at 2.25 volts, but chip 104a only has a 1.2 volt internal supply. Thus, the I/O devices within the I/O rings 106a–106b must be specially designed to handle the voltage mismatch.

The I/O rings 106a–106b generally have voltages greater than the internal supply voltages of the chips. For example, the ring voltage of I/O ring 106a can be, for example, 3.3 volts, and the ring voltage of I/O ring 106b can be, for example, 5 volts. Thus, in the above example, the I/O ring 106b of chip 104b provides a 5 volt signal to the I/O ring 106a of chip 104a, which operates at 3.3 volts.

Conventionally, a single N-pass gate could be used as a voltage tolerant I/O circuit. FIG. 2A is a schematic diagram showing a prior art N-pass gate I/O circuit 200. The N-pass gate I/O circuit 200 includes an n-channel transistor 202 having a first terminal coupled to a pad I/O 210, a second terminal coupled to an input buffer 204, and a gate coupled to the ring voltage, referred to as the ring $V_{DD}$. Although, the input buffer 204 illustrated in FIG. 2A is an inverter, it should be noted that the N-pass gate I/O circuit 200 can be utilized with any type of input device, such as a differential pair.

Because transistor 202 is an n-channel transistor, the highest voltage that can occur at node 206 is Ring $V_{DD}-V_{Tn}$, regardless of the voltage applied at pad I/O 210. Thus, the prior art N-pass gate I/O circuit 200 will operate properly if $V_{DD}-V_{Tn}$ is high enough to fully turn on and off the input buffer 204. However, a leakage current typically occurs when utilizing the a prior art N-pass gate I/O circuit 200, as illustrated next in FIG. 2B.

FIG. 2B is a timing diagram 250 showing voltage and current levels during operation of the prior art N-pass gate I/O circuit. The timing diagram 250 illustrates the voltage levels of the pad I/O 210, node 206, node 208, and the current level 252 within the input buffer 204 when the pad I/O 210 rises from LOW to HIGH. As illustrated in FIG. 2B, when the pad I/O 210 is LOW, node 206 is LOW and node 208 is HIGH because of inverter 204. When the pad I/O 210 transitions to a HIGH state, the voltage on node 206 rises to Ring $V_{DD}-V_{Tn}$. As mentioned above, the highest voltage that can occur at node 206 is Ring $V_{DD}-V_{Tn}$, regardless of the voltage applied at pad I/O 210, because transistor 202 is an n-channel transistor. The Ring $V_{DD}-V_{Tn}$ voltage at the input of the inverter 204 causes node 208 to transition to a LOW voltage. However, if $V_{DD}-V_{Tn}$ is not high enough to fully turn off the p-channel transistor in the input buffer 204, a leakage current can result. The current level 252 illustrates the crossover current that occurs during switching of the CMOS transistors. As can be seen, if $V_{DD}-V_{Tn}$ is not high enough to fully turn off the p-channel transistor in the input buffer 204, a leakage current 254 can remain after the pad I/O 210 goes HIGH. To address this issue, a keeper circuit can be utilized with the I/O circuit.

FIG. 3A is a schematic diagram showing a prior art keeper based I/O circuit 300. The keeper based I/O circuit 300 includes an n-channel transistor 302 having a gate coupled to Ring $V_{DD}$, a first terminal coupled to a pad I/O 310, and a second terminal coupled to node 306, which is coupled to an input buffer 304. The output of the input buffer 304 is coupled to the gate of a p-channel keeper transistor 312, which includes a first terminal coupled to Ring $V_{DD}$ and a second terminal coupled to node 306. As above, it should be noted that the input buffer 304 can be any type of input device, such as a differential pair.

In operation, when the pad I/O 310 goes high, transistor 302 raises the voltage on node 306 to Ring $V_{DD}-V_{Tn}$. As mentioned above, because transistor 302 is an n-channel transistor, the highest voltage that can occur at node 306 is Ring $V_{DD}-V_{Tn}$, regardless of the voltage applied at pad I/O 310. The inverter 304 begins to pull node 308 LOW, which places a LOW at the gate of transistor 312, turning transistor 312 ON. In response, transistor 312 pulls up node 306 to Ring $V_{DD}$. As a result, node 306 is made HIGH enough to switch inverter 304. Unfortunately, the keeper transistor 312 slows the I/O circuit 300 down when the pad 310 goes LOW.

FIG. 3B is a timing diagram 350 showing voltage and current levels during operation of the prior art keeper based I/O circuit. The timing diagram 350 illustrates the voltage levels of the pad I/O 310, node 306, node 308, and the current level 352 within the input buffer 304 when the pad I/O 310 rises from LOW to HIGH. As illustrated in FIG. 3B, when the pad I/O 310 is LOW, node 306 is LOW and node 308 is HIGH because of inverter 304. When the pad I/O 310 transitions to a HIGH state, the voltage on node 306 rises to Ring $V_{DD}$ in a stepwise manner. In particular, the voltage on node 306 initially rises to Ring $V_{DD}-V_{Tn}$, illustrated at point 354 when the pad I/O goes HIGH. Then, the keeper p-channel transistor 312 allows current to flow from Ring $V_{DD}$ to node 306, raising the voltage at node 306 to Ring $V_{DD}$ at point 356. The Ring $V_{DD}$ voltage at node 306 is then high enough to turn. OFF the p-channel transistor within the inverter 304 and turn ON the n-channel transistor in the inverter 304, thus allowing node 308 to fall to zero volts. As illustrated by the graph of the crossover current 352, the prior art keeper based I/O circuit prevents leakage from occurring. Unfortunately, the keeper p-channel transistor 312 of the prior art keeper based I/O circuit 300 slows down the switching time for the input circuit because the keeper p-channel transistor 312 must be overcome to transition the voltage on node 306 from HIGH to LOW.

In view of the foregoing, there is a need for a voltage tolerant circuit for protecting an input buffer. The voltage tolerant circuit should not produce a leakage current, allow fast switching, and should not pump current back into the pad.

SUMMARY OF THE INVENTION

Embodiments of the present invention fill these needs by providing a method for protecting an input buffer. Broadly speaking, a current from a p-supply to an input buffer is lowered when an input voltage to the input buffer is HIGH. The p-supply being a voltage supplied to a p-channel transistor in the input buffer. In addition, the p-supply is set to a particular voltage when the input voltage to the input buffer is tolerant. The particular voltage being at a specific value such that input transistors within the input buffer do not experience overstress voltages. Generally, overstress voltages are voltages having values higher than the internal voltage of a Ring I/O wherein the input buffer is located. Optionally, p-supply can be prevented from supplying current to the input buffer when an input voltage to the input buffer is HIGH. Also optionally, a generator can be used to design the voltage tolerant I/O.

In an additional embodiment, a voltage tolerant circuit for protecting an input buffer is disclosed. The voltage tolerant circuit includes an n-channel pass gate transistor having a first terminal coupled to a pad I/O, a second terminal coupled to the input of an input buffer, and a gate coupled to an internal ring voltage (Ring $V_{DD}$). In addition, a p-supply p-channel transistor is included that has a gate coupled to the pad I/O, a first terminal coupled to Ring $V_{DD}$, and a second terminal coupled to a p-supply of the input buffer. As above, the p-supply is a voltage supplied to a p-channel transistor in the input buffer. In one embodiment, an additional p-channel transistor and n-channel transistor can be included to prevent the p-supply from becoming too low. For example, a p-channel transistor can be included that has a first terminal coupled to the pad I/O, a gate coupled to Ring $V_{DD}$, and a second terminal coupled to a first terminal of an n-channel transistor. The n-channel transistor can include a gate coupled to Ring $V_{DD}$ and a second terminal coupled to the p-supply of the input buffer. As above, the voltage tolerant I/O can be designed using a generator.

A voltage tolerant architecture is disclosed in a further embodiment of the present invention. The voltage tolerant architecture includes an input buffer and a voltage tolerant I/O circuit. The input buffer includes an input, an output, and a p-supply. As above, the p-supply is a voltage supplied to a p-channel transistor in the input buffer. The voltage tolerant I/O circuit includes an n-channel pass gate transistor having a first terminal coupled to a pad I/O and a second terminal coupled an input of an input buffer. In addition, a p-supply p-channel transistor is included in the voltage tolerant I/O circuit that has a gate coupled to the pad I/O, a first terminal coupled to Ring $V_{DD}$, and a second terminal coupled to the p-supply of the input buffer. The input buffer can be any circuit. For example, the input buffer can be an inverter that includes a p-channel transistor having a first terminal coupled to the p-supply of the input buffer, a gate coupled to the input of the input buffer, and a second terminal coupled to an output of the input buffer. As above, the voltage tolerant I/O circuit can be designed using a generator. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for a voltage tolerant circuit for protecting an input buffer. Broadly speaking, embodiments of the present invention prevent a p-supply for an input buffer from supplying current to the input buffer when the input to the input buffer is high. In addition, the p-supply is set to a particular voltage when the input to the input buffer is HIGH. The particular voltage is set at a specific value such that input transistors within the input buffer do not experience overstress voltages. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

The high voltage at the pad, which is a voltage higher than the ring voltage, will be referred to hereinafter as the "tolerant voltage." The voltage of the I/O ring will be referred to hereinafter as the "ring voltage." The internal voltage of the chip will be referred to hereinafter as the "core voltage." "P-supply" refers to a $V_{DD}$ voltage supplied to a p-channel transistor in an input buffer. "Overstress" occurs when a transistor experiences a voltage higher than the ring voltage across any junction.

Figure 1:
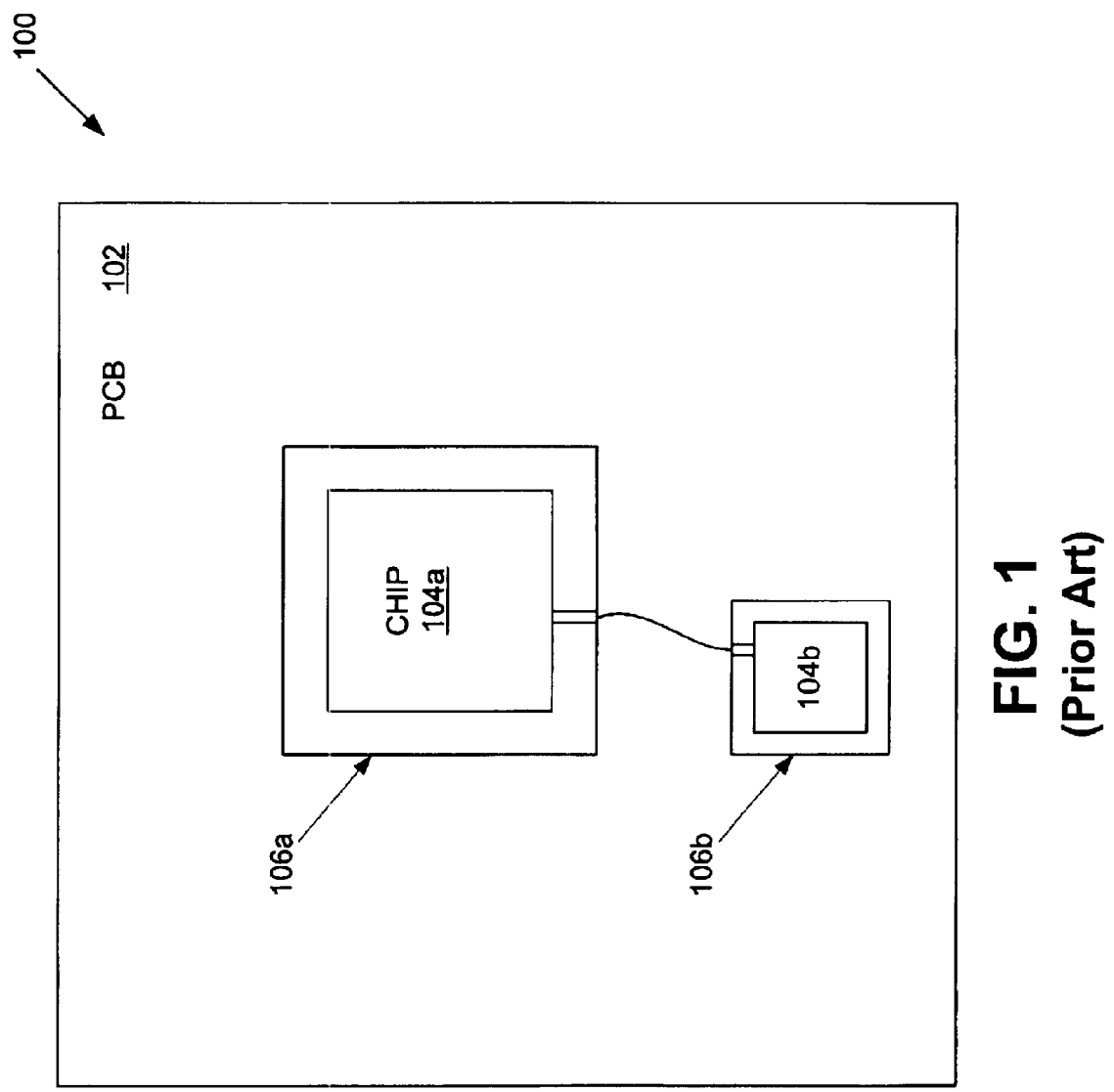
FIG. 1 shows an exemplary printed circuit board (PCB) configuration.
Figure 2A:
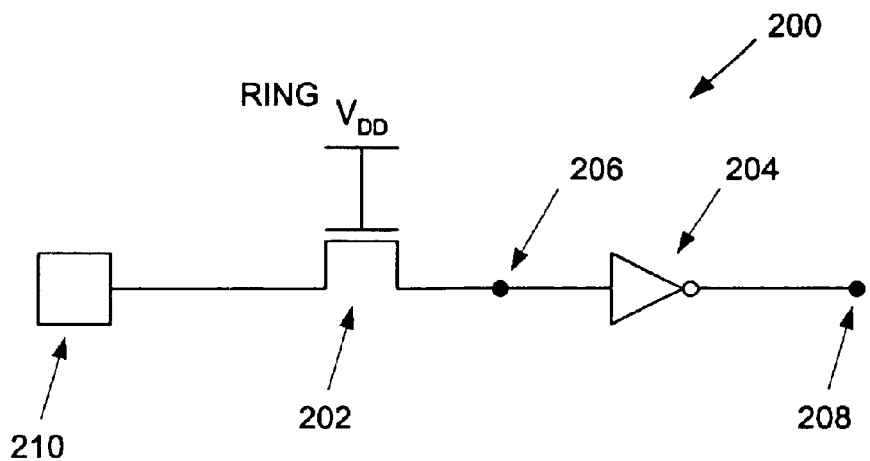
FIG. 2A is a schematic diagram showing a prior art N-pass gate I/O circuit.
Figure 2B:
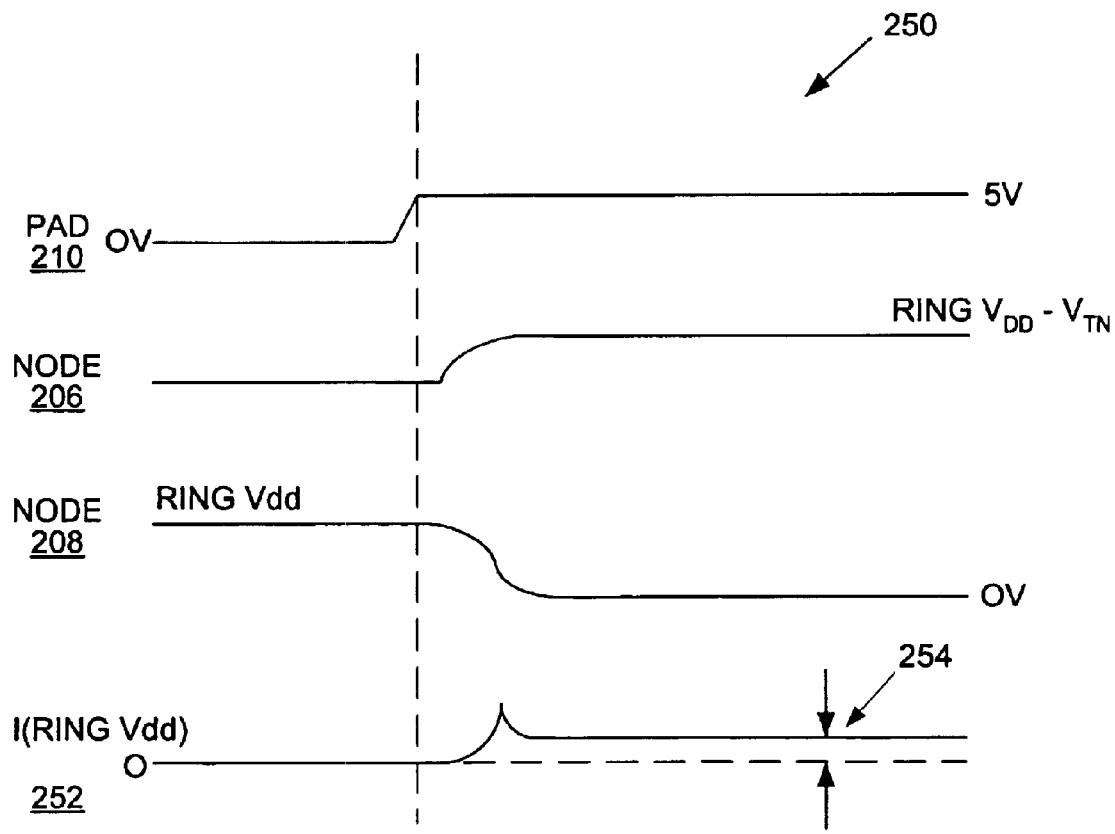
FIG. 2B is a timing diagram showing voltage and current levels during operation of the prior art prior art N-pass gate I/O circuit.
Figure 3A:
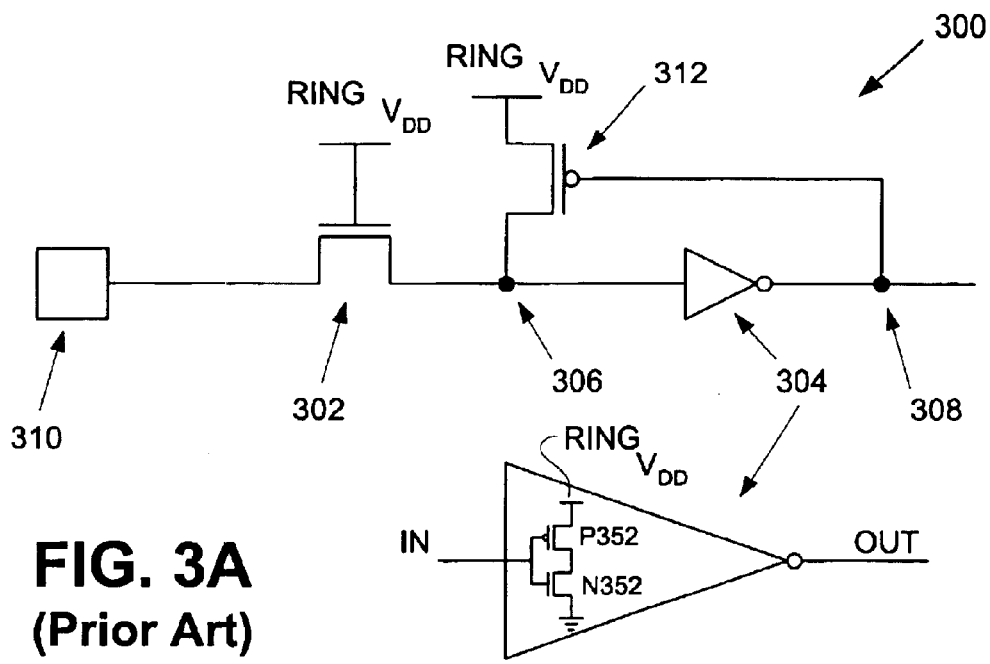
FIG. 3A is a schematic diagram showing a prior art keeper based I/O circuit.
Figure 3B:
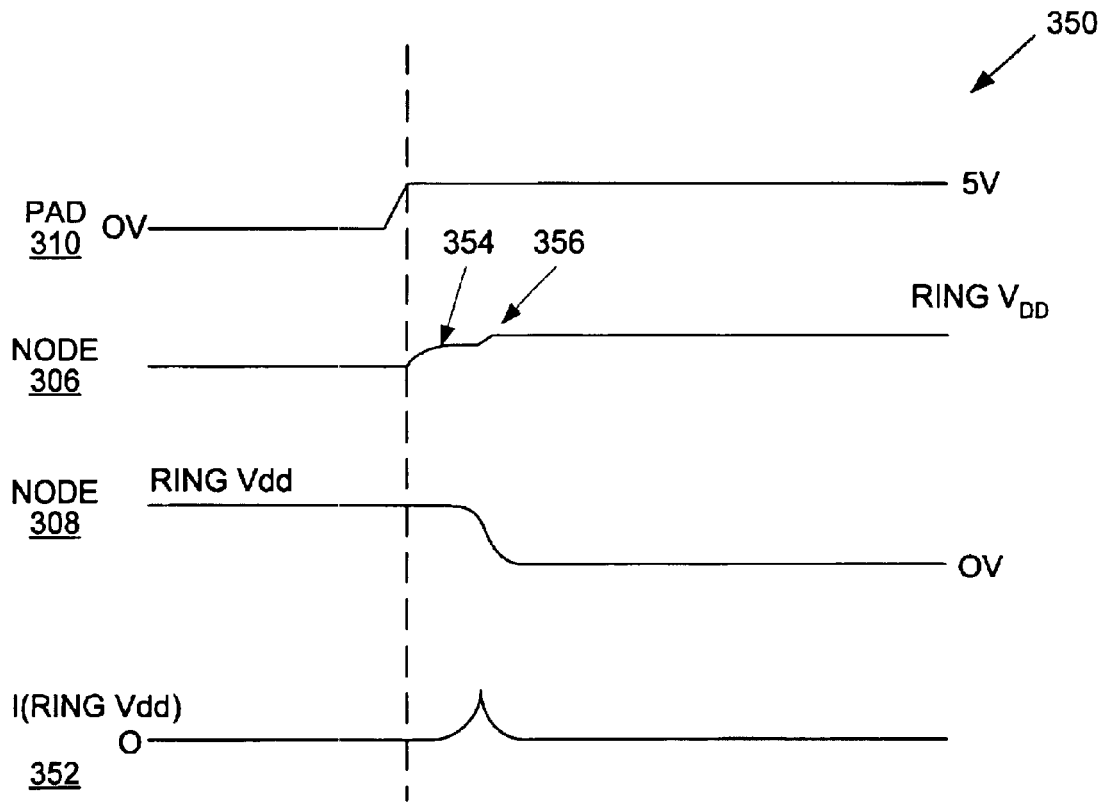
FIG. 3B is a timing diagram showing voltage and current levels during operation of the prior art keeper based I/O circuit.
Figure 4:
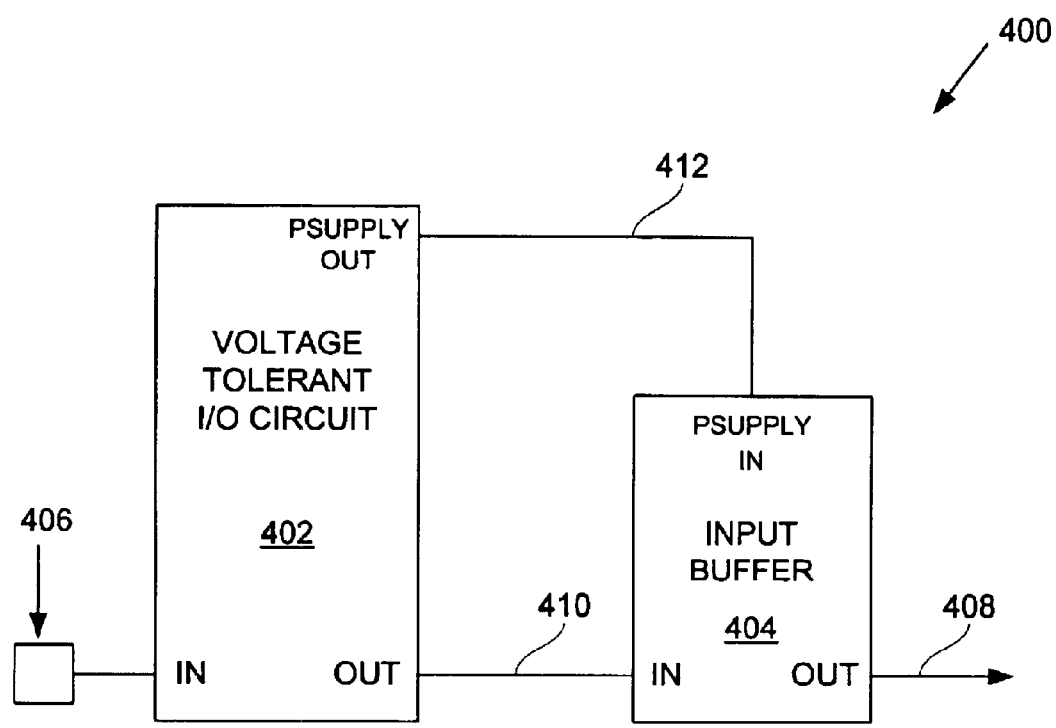
FIG. 4 is a block diagram showing a voltage tolerant architecture for protecting an I/O buffer, in accordance with an embodiment of the present invention.

FIGS. 1–3B were described in terms of the prior art. FIG. 4 is a block diagram showing a voltage tolerant architecture 400 for protecting an I/O buffer, in accordance with an embodiment of the present invention. The voltage tolerant architecture 400 includes a voltage tolerant I/O circuit 402 coupled to an input buffer 404. In particular, the voltage tolerant I/O circuit has an input coupled to a pad I/O 406, which supplies the tolerant voltage to the voltage tolerant I/O circuit 402. In addition, the voltage tolerant I/O circuit 402 includes a signal output 410, which is coupled to a signal input of the input buffer 404, and a p-supply output 412, which supplies current to the p-supply input of the input buffer 404. The p-supply input generally is provided to a p-channel transistor within the input buffer 404.

In operation, the voltage tolerant I/O circuit 402 sets the voltage provided on the p-supply output 412 to a specific value such that the input transistors within the input buffer do not experience overstress voltages when the input signal 406 is tolerant. In addition, the voltage tolerant I/O circuit 402 prevents current from being supplied to the input buffer 404 from the p-supply output 412 when the input signal 406 is tolerant.

Figure 5:
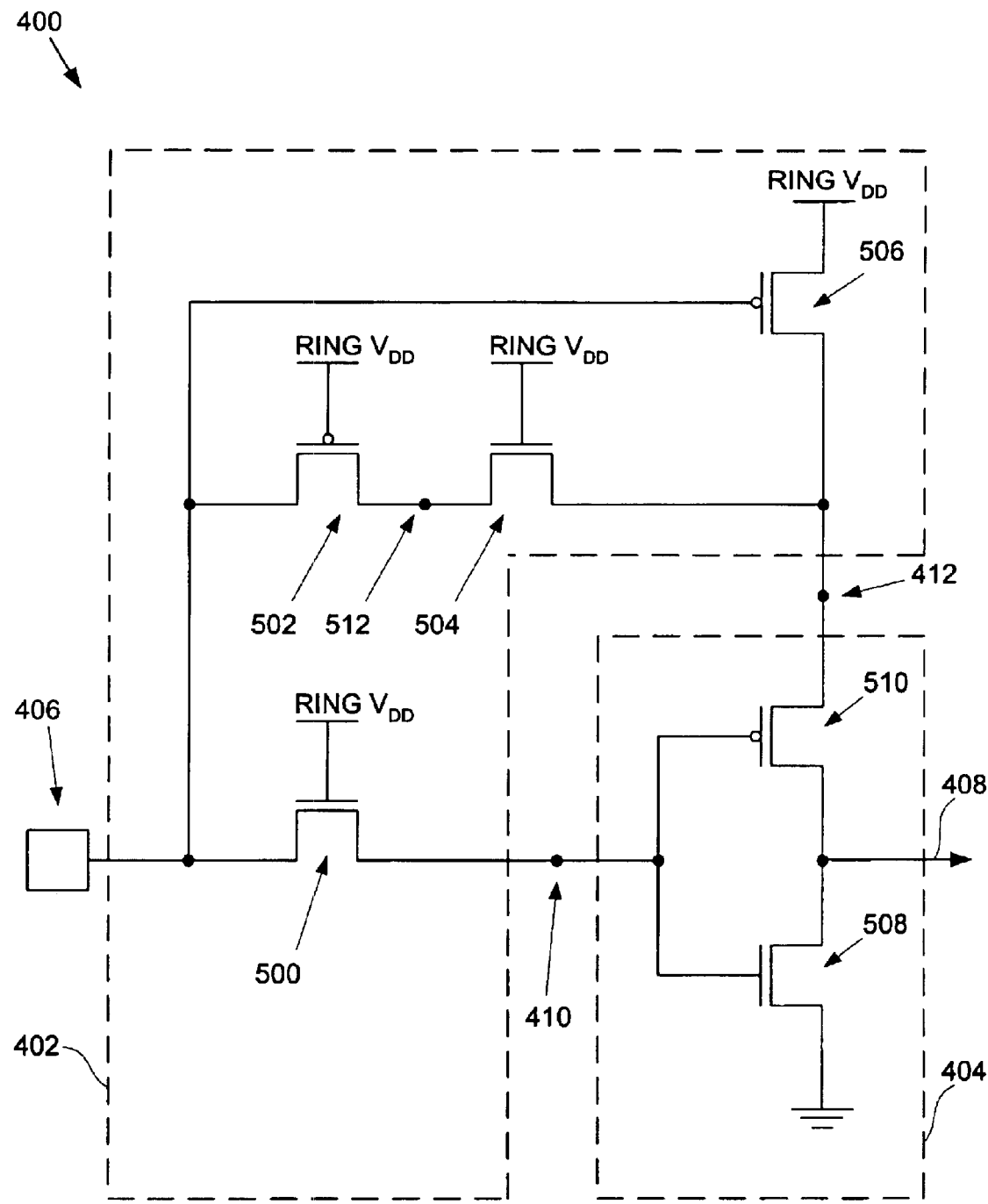
FIG. 5 is a schematic diagram showing a voltage tolerant architecture for protecting an I/O buffer, in accordance with an embodiment of the present invention.

FIG. 5 is a schematic diagram showing a voltage tolerant architecture 400 for protecting an I/O buffer, in accordance with an embodiment of the present invention. The voltage tolerant architecture 400 includes a voltage tolerant I/O circuit 402 coupled to an input buffer 404. Although the input buffer illustrated in FIG. 5 is an inverter, it should be noted that the input buffer 404 can be any type of input device, such as a differential pair.

The voltage tolerant I/O circuit 402 includes an n-channel pass gate transistor 500 having a first terminal coupled to a pad I/O 406, a gate coupled to the ring voltage (Ring $V_{DD}$), and a second terminal coupled to the input buffer 404 via node 410. In addition, the voltage tolerant I/O circuit 402 includes a p-channel transistor 502 having a first terminal coupled to the pad I/O 406, a gate coupled to Ring $V_{DD}$, and a second terminal coupled to a first terminal of an n-channel transistor 504. The n-channel transistor 504 also includes a gate coupled to Ring $V_{DD}$, and a second terminal coupled to the p-supply input of the input buffer 404 via node 412. Further included in the voltage tolerant I/O circuit 402 is a p-supply p-channel transistor 506 having a gate coupled to the pad I/O 406, a first terminal coupled to Ring $V_{DD}$, and a second terminal coupled to the p-supply input of the input buffer 404 via node 412.

The exemplary input buffer 404 of FIG. 5 functions as an inverter and includes an n-channel transistor 508 having a gate coupled to the input buffer 404 input at node 410, a first terminal coupled to the input buffer output 408, and a second terminal coupled to ground. Further included in the input buffer 404 is a p-channel transistor 510 having a gate coupled to the input buffer 404 input at node 410, a first terminal coupled to the p-supply of the input buffer at node 412, and a second terminal coupled to the input buffer output 408.

The voltage tolerant I/O circuit 402 provides both an input signal and a p-supply voltage to the input buffer 404. In particular, the voltage tolerant I/O circuit 402 provides the input signal to the input buffer 404 via node 410, and the p-supply voltage via node 412. The p-supply voltage operates as the $V_{DD}$ for the input buffer 404. As mentioned above, the voltage tolerant I/O circuit 402 operates to set the voltage provided on the p-supply output at node 412 to a specific value when the input signal to the input buffer 402 at node 406 is Tolerant-High. In this case, the voltage tolerant I/O circuit 402 sets the p-supply output at node 412 to a particular voltage such that the input transistors within the input buffer do not experience overstress voltages. In addition, the voltage tolerant I/O circuit 402 prevents current from being supplied to the input buffer 404 from the p-supply output at node 412 when the input signal at node 410 is HIGH.

More specifically, when the pad I/O 406 voltage is Tolerant-High, node 410 rises to Ring $V_{DD}-V_{Tn}$, regardless of the actual value of the Tolerant-High voltage at the pad I/O. As mentioned previously, because transistor 500 is an n-channel transistor, the highest voltage that can occur at node 410 is Ring $V_{DD}-V_{Tn}$, regardless of the voltage applied at pad I/O 406. However, Ring $V_{DD}-V_{Tn}$ may be insufficient to fully turn OFF p-channel transistor 510 within the input buffer 404. Hence, as illustrated in FIG. 5, another p-channel transistor 506 is coupled to the pad I/O 406 in series with the p-channel transistor 510 of the input buffer 404. When the pad I/O voltage is Tolerant-High, the Tolerant-High voltage at the gate of the p-channel transistor 506 turns p-channel transistor 506 OFF. As a result, current flow across p-channel transistor 506 stops, thus preventing current from being supplied to the input buffer 404 from the p-supply output at node 412.

However, when p-channel transistor 506 turns OFF, node 412 can fall to zero volts. As a result, the gate/drain junction of p-channel transistor 506 may experience a voltage that is larger than p-channel transistor 506 can tolerate. For example, if node 412 falls to zero volts and the voltage at the gate of p-channel transistor 506 is 5 volts, the voltage across the gate/drain junction of p-channel transistor 506 will be 5 volts, which is larger than transistor 506 can tolerate. This can happen, for example, if p-channel transistor 506 could only tolerate 3.6 volts across any junction. Hence, in particular configurations of the voltage tolerant I/O circuit 402, the voltage at p-supply should be maintained at particular levels when p-channel transistor 506 is OFF.

To perform this function, an embodiment of the present invention utilizes p-channel transistor 502 in conjunction with n-channel transistor 504. As mentioned previously, the pad I/O voltage generally is higher than Ring $V_{DD}$. As long as the Pad I/O voltage is higher than Ring $V_{DD}+V_{TP}$, the p-channel transistor 502 will conduct even though the gate of p-channel transistor 502 has a voltage of Ring $V_{DD}$. As will be appreciated by those skilled in the art, a p-channel transistor will conduct whenever a voltage greater than $V_{TP}$ exists across the gate/source junction of the p-channel transistor. Thus, for example, when the pad I/O voltage is 5 volts, which is a HIGH, and the gate of p-channel transistor 502 is 3.3 volts, which is the Ring $V_{DD}$, the gate/source junction of p-channel transistor 502 is greater than $V_{TP}$. As a result, p-channel transistor 502 conducts and raises the voltage of node 512 to 5 volts even though the voltage at the gate of p-channel transistor 502 is Ring $V_{DD}$.

Since the voltage at the gate of transistor 504 is at Ring $V_{DD}$, transistor 504 is always ON. Thus, when the voltage at node 512 is tolerant HIGH, the p-supply voltage at node 412 is set to Ring $V_{DD}-V_{Tn}$, regardless of the actual value of the HIGH voltage at node 512. As mentioned previously, the highest voltage that can occur at node 412 or p-supply is Ring $V_{DD}-V_{Tn}$, regardless of the voltage applied at node 512 because transistor 504 is an n-channel transistor.

As a result, when the voltage at the pad I/O 406 is tolerant HIGH, the p-supply p-channel transistor 506 does not experience a voltage across any junction that is greater than the transistor 506 can tolerate. For example, when the voltage at the pad I/O 406 is 5 volts, the voltage at the gate of transistor 506 is 5 volts, the voltage at the source of transistor 506 is 3.3 volts (Ring $V_{DD}$), and the voltage at the drain of transistor 506 is Ring $V_{DD}-V_{Tn}$. Thus, no junction of p-channel transistor 506 experiences a voltage greater than 3.6 volts, which is the highest voltage the p-channel transistor 506 can experience across any junction.

It should be noted that n-channel transistor 504 also prevents the full pad I/O voltage from being applied to the p-supply at node 412 to prevent leakage at transistor 510 in the input buffer 404. For example, if node 412 was allowed to rise to 5 volts when the voltage at the pad I/O was tolerant HIGH, resulting in zero volts at the output 408 of the input buffer 404, the voltage across the source/drain junction of transistor 510 would be 5 volts, which is outside the acceptable voltage range for transistor 510.

When the pad I/O 406 voltage is LOW, node 410 also is LOW, which places a LOW at the gates of transistors 510 and 508. Hence, p-channel transistor 510 is turned ON and n-channel transistor 508 is turned OFF. In addition, the LOW voltage at the pad I/O 406 places a LOW at the gate of the p-supply p-channel transistor 506, turning transistor 5060N and raising the voltage of p-supply at node 412 to Ring $V_{DD}$. Since transistor 510 is ON and transistor 508 is OFF, the output 408 of the input buffer 404 rises to Ring $V_{DD}$.

Thus, embodiments of the present invention prevent current leakage and overstress from occurring in the transistors of the input buffer 404. In particular, the voltage tolerant I/O circuit 402 prevents current leaks by turning off the p-supply current at node 412 when the pad I/O voltage is tolerant HIGH. In addition, the voltage tolerant I/O circuit 402 controls the p-supply voltage at node 412 such that the input buffer is protected from overstress voltages.

Figure 6:
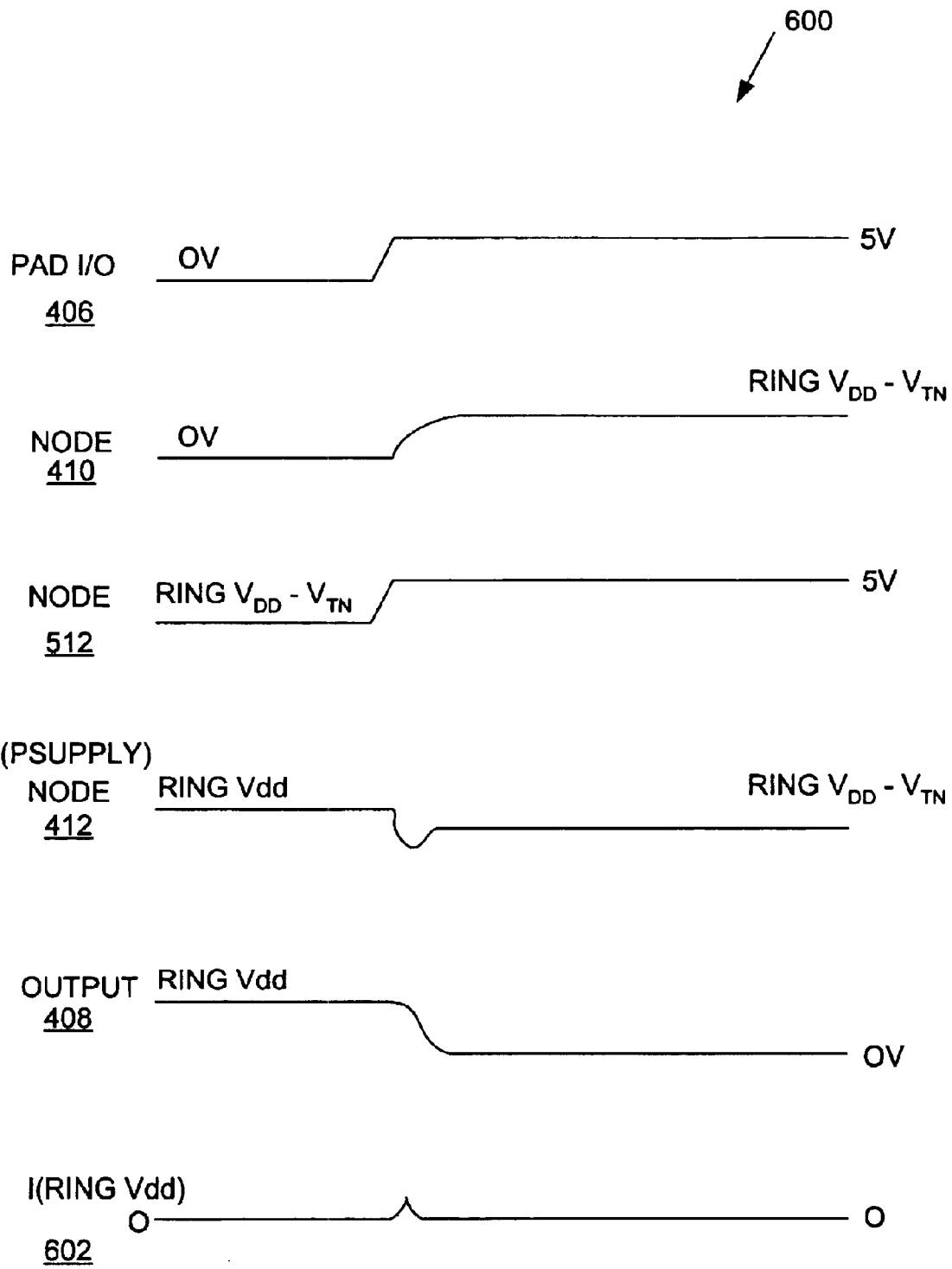
FIG. 6 is a timing diagram showing voltage and current levels during operation of the present invention.

FIG. 6 is a timing diagram 600 showing voltage and current levels during operation of the present invention. The timing diagram 600 illustrates the voltage levels of the pad I/O 406, node 410, node 512, p-supply at node 412, the output 408, and the current level 602 within the input buffer 404 when the pad I/O 406 rises from LOW to tolerant HIGH. As illustrated in FIG. 6, when the pad I/O 406 is LOW, node 410 is LOW and the output at node 408 is at Ring $V_{DD}$ because of inverter 404. Also when the pad I/O 406 is LOW, node 512 is $V_{DD}-V_{tn}$ and the p-supply at node 412 is at Ring $V_{DD}$.

When the pad I/O 406 transitions to a tolerant HIGH state, the voltage on node 410 rises to Ring $V_{DD}-V_{Tn}$. As mentioned above, the highest voltage that can occur at node 410 is Ring $V_{DD}-V_{Tn}$, regardless of the voltage applied at pad I/O 406, because transistor 500 is an n-channel transistor. In addition, when pad I/O transitions to a tolerant HIGH state, the voltage on node 512 transitions to the same tolerant HIGH state. As a result, the voltage on the p-supply at node 412 transitions for Ring $V_{DD}$ to Ring $V_{DD}-V_{Tn}$. In particular, when the voltage on the pad I/O 406 is LOW, the p-channel p-supply transistor supplies a Ring $V_{DD}$ voltage to the p-supply at node 412. When the voltage on the pad I/O 406 transitions to the tolerant voltage, the p-supply transistor turns OFF, and transistor 504 supplies a Ring $V_{DD}-V_{Tn}$ voltage to the p-supply at node 412. The Ring $V_{DD}-V_{Tn}$ voltage at the input 410 and the p-supply 412 of the input buffer 404 causes the output 408 of the input buffer 404 to transition from Ring $V_{DD}$ to 0 volts. The current level 602 illustrates the crossover current that occurs during switching of the CMOS transistors. As can be seen, a leakage current generally does not occur after the pad I/O 406 goes tolerant HIGH. Although, in some embodiments a small crossover current can briefly occur as illustrated in FIG. 6. However, because the p-supply transistor turns OFF when the pad I/O 406 is tolerant HIGH, the crossover current is significantly reduced.

Figure 7A:
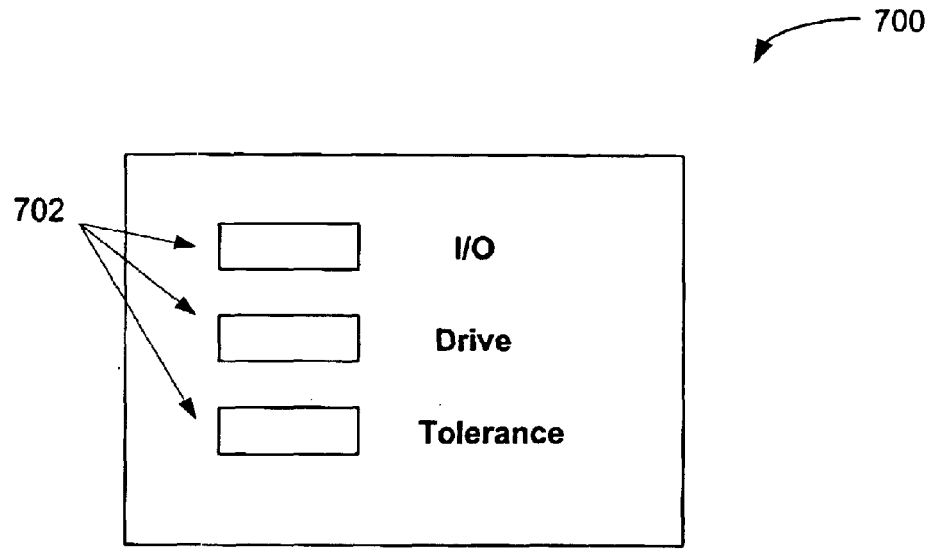
FIG. 7A is a block diagram showing an exemplary simplified I/O generator graphical user interface (GUI) front end, in accordance with an embodiment of the present invention.

In one embodiment, optimum placement and utilization of the voltage tolerant circuit techniques of the present invention is implemented utilizing an I/O generator. FIG. 7A is a block diagram showing an exemplary simplified I/O generator graphical user interface (GUI) front end 700, in accordance with an embodiment of the present invention. The exemplary I/O generator GUI 700 illustrates one view utilized for entering parameters into fields 702 to define a particular I/O application. Broadly speaking, the I/O generator checks the validity of the entered data and executes appropriate generators to define the I/O application. After receiving data utilizing the GUI front end view 700, an I/O generator of the embodiments of the present invention processes the data utilizing a I/O generator backend, as described next with reference to FIG. 7B.

Figure 7B:
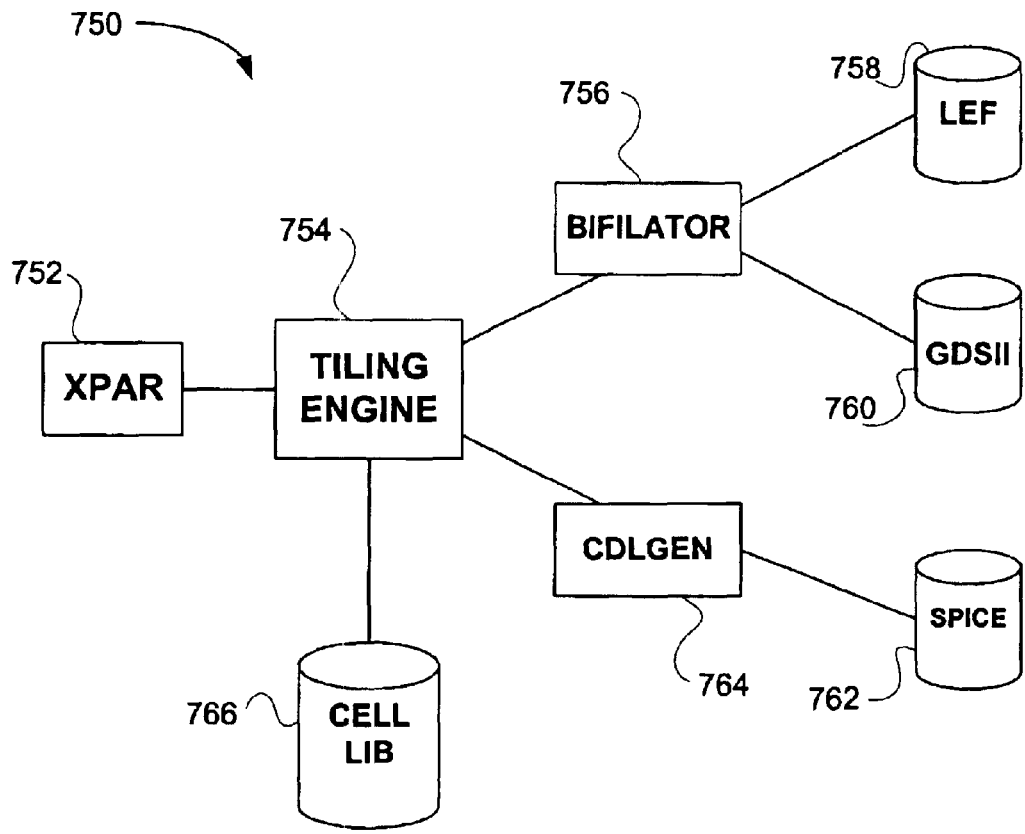
FIG. 7B is a block diagram showing an exemplary I/O generator backend 750, in accordance with an embodiment of the present invention.

FIG. 7B is a block diagram showing an exemplary I/O generator backend 750, in accordance with an embodiment of the present invention. The I/O generator backend 750 comprises a tiling engine 754, a Bifilator process 756, a CDLGEN process 764, and a cell library 766. Generally speaking, these processes function together to generate a LEF model 758, a GDSII model 760, and a SPICE model 762 for the particular I/O application. The LEF model 758 comprises place and route information, which is utilized by routers to manufacture integrated circuits. The GDSII model 760 comprises mask layouts and is utilized by semiconductor foundries. The SPICE model 762 includes circuit interconnection definitions, operational properties, and schematic diagrams of the I/O application. Thus, the designer can use the SPICE model of the application for cross verification.

As mentioned above, the exemplary I/O generator backend 750 processes the data received via the GUI front end 700. More specifically, the XPAR process 752 encapsulates the rules needed to utilize particular cell layouts stored in the cell library. These rules, along with the parameter data for the I/O application are then provided to the tiling engine 754 for optimization and cell placement. By separating the functions of the XPAR process 752 from those of the tiling engine 754, individual rules can be altered for specific applications without altering the functions and placement algorithms utilized in the timing engine 754.

The Bifilator process 756 generates an interface around a particular I/O device. Generally, on an I/O there may exist a variety of points for interfacing with the I/O. As a result, the entire routing configuration may change when a user changes the parameters of the I/O, requiring intense reconfiguration. To address this issue, the Bifilator process 756 builds an interface around the I/O, which the user can use to interface with the I/O without configuring each routing point.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A voltage tolerant circuit for protecting an input buffer, comprising:
    an n-channel pass gate transistor having a first terminal coupled to a pad I/O, a second terminal coupled to an input of an input buffer, and a gate coupled to an internal ring voltage (Ring $V_{DD}$);
    a p-supply p-channel transistor having a gate coupled to the pad I/O, a first terminal coupled to Ring $V_{DD}$, and a second terminal coupled to a p-supply of the input buffer, wherein the p-supply is a voltage supplied to a p-channel transistor in the input buffer; and
    a p-channel transistor having a first terminal coupled the pad I/O, a gate coupled to Ring $V_{DD}$, and a second terminal coupled to a first terminal of an n-channel transistor.

2. A voltage tolerant circuit as recited in claim 1, wherein the n-channel transistor further includes a gate coupled to Ring $V_{DD}$ and a second terminal coupled to the p-supply of the input buffer.

3. A voltage tolerant circuit as recited in claim 1, wherein the input buffer is an inverter.

4. A voltage tolerant circuit as recited in claim 3, wherein the inverter includes a p-channel transistor having a first terminal coupled to the p-supply of the input buffer, a gate coupled to the input of the input buffer, and a second terminal coupled to an output of the input buffer.

5. A voltage tolerant circuit as recited in claim 4, wherein the inverter further includes an n-channel transistor having a first terminal coupled to the output of the input buffer, a gate coupled to the input of the input buffer, and a second terminal coupled to ground.

6. A voltage tolerant circuit as recited in claim 1, wherein the voltage tolerant I/O is implemented utilizing an I/O generator.

7. A voltage tolerant architecture, comprising:
    an input buffer having an input, an output, and a p-supply, wherein the p-supply is a voltage supplied to a p-channel transistor in the input buffer; and
    a voltage tolerant I/O circuit having an n-channel pass gate transistor having a first terminal coupled to a pad I/O and a second terminal coupled to an input of an input buffer, and a p-supply p-channel transistor having a gate coupled to the pad I/O a first terminal coupled to Ring $V_{DD}$, and a second terminal coupled to the p-supply of the input buffer, the voltage tolerant I/O circuit further comprising a p-channel transistor having a first terminal coupled to the pad I/O a gate coupled to Ring $V_{DD}$, and a second terminal coupled to a first terminal of an n-channel transistor.

8. A voltage tolerant architecture as recited in claim 7, wherein the n-channel transistor further includes a gate coupled to Ring $V_{DD}$ and a second terminal coupled to the p-supply of the input buffer.

9. A voltage tolerant architecture as recited in claim 7, wherein the input buffer is an inverter.

10. A voltage tolerant architecture as recited in claim 9, wherein the inverter includes a p-channel transistor having a first terminal coupled to the p-supply of the input buffer, a gate coupled to the input of the input buffer, and a second terminal coupled to an output of the input buffer.

11. A voltage tolerant architecture as recited in claim 7, wherein the voltage tolerant I/O circuit is implemented utilizing an I/O generator.

* * * * *